United States Patent [19]

Chung

[11] Patent Number: 5,789,264
[45] Date of Patent: Aug. 4, 1998

[54] METHOD FOR MANUFACTURING A THIN FILM ACTUATED MIRROR HAVING A FLAT LIGHT REFLECTING SURFACE

[75] Inventor: Jae-Hyuk Chung, Seoul, Rep. of Korea

[73] Assignee: Daewoo Electronics Co., Ltd., Seoul, Rep. of Korea

[21] Appl. No.: 716,761

[22] Filed: Sep. 23, 1996

[30] Foreign Application Priority Data

| Mar. 27, 1996 | [KR] | Rep. of Korea | 96-08471 |
| May 23, 1996 | [KR] | Rep. of Korea | 96-17800 |
| May 23, 1996 | [KR] | Rep. of Korea | 96-17803 |

[51] Int. Cl.$^6$ ................................. H01L 21/265
[52] U.S. Cl. .................. 437/40; 437/41; 437/50; 437/51
[58] Field of Search .................... 437/40, 41, 29, 437/50, 51

[56] References Cited

U.S. PATENT DOCUMENTS

| 4,259,779 | 4/1981 | Ipri et al. | 29/571 |
| 4,692,994 | 9/1987 | Moniwa et al. | 437/40 |
| 5,481,396 | 1/1996 | Ji et al. | 359/295 |
| 5,541,679 | 7/1996 | Yang | 353/98 |
| 5,550,066 | 8/1996 | Tang et al. | 437/40 TFT |
| 5,550,680 | 8/1996 | Yoon | 359/850 |
| 5,579,179 | 11/1996 | Ji et al. | 359/846 |
| 5,589,084 | 12/1996 | Ji et al. | 359/295 |

*Primary Examiner*—John Niebling
*Assistant Examiner*—Michael S. Lebentritt
*Attorney, Agent, or Firm*—Pennie & Edmonds LLP

[57] ABSTRACT

An inventive method for the manufacture of an array of thin film actuated mirrors includes the steps of: providing an active matrix; forming a plurality of insulating layers having a planarized top surface on top of the active matrix; forming a thin film sacrificial layer having an array of empty cavities on the planarized top surface of the plurality of insulating layers; forming an array of actuating structures on top of the thin film sacrificial layer including the empty cavities, each of the actuating structures including a first thin film electrode, a thin film electrodisplacive member, a second thin film electrode, an elastic member and a conduit; and removing the thin film sacrificial layer, thereby forming the array of thin film actuated mirrors. Since the thin film layers constituting each of the actuating structures are formed on the planarized top surface of the insulating layers, the thin film layers constituting each of the actuating structures are flat, allowing the first thin film electrode placed on top thereof, which also acts as a mirror, to have a flat top surface, thereby increasing the overall optical efficiency and performance of the array.

12 Claims, 10 Drawing Sheets

METHOD FOR MANUFACTURING A THIN FILM ACTUATED MIRROR HAVING A FLAT LIGHT REFLECTING SURFACE

FIELD OF THE INVENTION

The present invention relates to an optical projection system; and, more particularly, to an improved method for the manufacture of an array of M x N thin film actuated mirrors for use in the system.

BACKGROUND OF THE INVENTION

Among the various video display systems available in the art, an optical projection system is known to be capable of providing high quality displays in a large scale. In such an optical projection system, light from a lamp is uniformly illuminated onto an array of, e.g., M x N, actuated mirrors, wherein each of the mirrors is coupled with each of the actuators. The actuators may be made of an electrodisplacive material such as a piezoelectric or an electrostrictive material which deforms in response to an electric field applied thereto.

The reflected light beam from each of the mirrors is incident upon an aperture of, e.g., an optical baffle. By applying an electrical signal to each of the actuators, the relative position of each of the mirrors to the incident light beam is altered, thereby causing a deviation in the optical path of the reflected beam from each of the mirrors. As the optical path of each of the reflected beams is varied, the amount of light reflected from each of the mirrors which passes through the aperture is changed, thereby modulating the intensity of the beam. The modulated beams through the aperture are transmitted onto a projection screen via an appropriate optical device such as a projection lens, to thereby display an image thereon.

In FIGS. 1A to 1G, there are illustrated manufacturing steps involved in manufacturing an array 100 of M x N thin film actuated mirrors 101, wherein M and N are integers, disclosed in a copending commonly owned application, U.S. Ser. No. 08/430,628, entitled "THIN FILM ACTUATED MIRROR ARRAY".

Figure 1A:
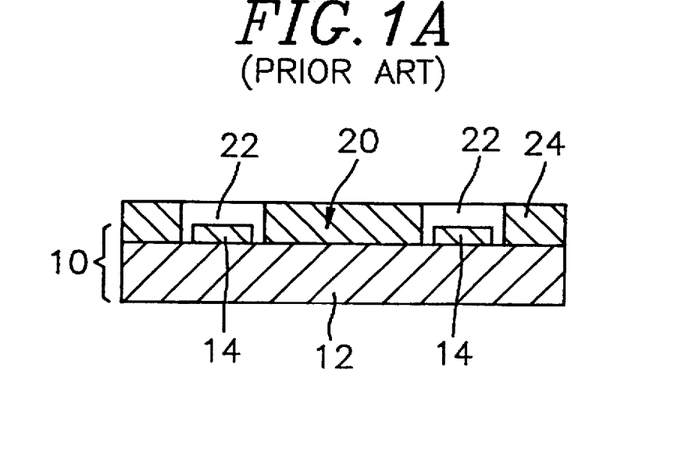
FIGS. 1A to 1GH provide schematic cross sectional views illustrating a method for the manufacture of an array of M x N thin film actuated mirrors previously disclosed.

The process for manufacturing the array 100 begins with the preparation of an active matrix 10 having a top surface and comprising a substrate 12, an array of M x N transistors (not shown) and an array of M x N connecting terminals 14.

In a subsequent step, there is formed on the top surface of the active matrix 10 a thin film sacrificial layer 24 by using a sputtering or an evaporation method if the thin film sacrificial layer 24 is made of a metal, a chemical vapor deposition (CVD) or a spin coating method if the thin film sacrificial layer 24 is made of a phosphor-silicate glass (PSG), or a CVD method if the thin film sacrificial layer 24 is made of a poly-Si.

Thereafter, there is formed a supporting layer 20 including an array of M x N supporting members 22 surrounded by the thin film sacrificial layer 24, wherein the supporting layer 20 is formed by: creating an array of M x N empty slots (not shown) on the thin film sacrificial layer 24 by using a photolithography method, each of the empty slots being located around the connecting terminals 14; and forming a supporting member 22 in each of the empty slots located around the connecting terminals 14 by using a sputtering or a CVD method, as shown in FIG. 1A. The supporting members 22 are made of an insulating material.

Figure 1B:
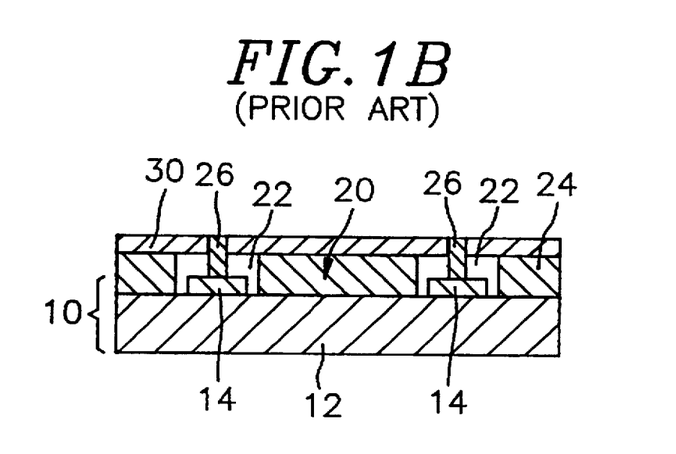

In a following step, an elastic layer 30 made of the same insulating material as the supporting members 22 is formed

2 on top of the supporting layer 20 by using a Sol-Gel, a sputtering or a CVD method.

Subsequently, a conduit 26 made of a metal is formed in each of the supporting members 22 by: first creating an array of M x N holes (not shown), each of the holes extending from top of the elastic layer 30 to top of the connecting terminals 14, by using an etching method; and filling therein with the metal to thereby form the conduit 26, as shown in FIG. 1B.

Figure 1C:
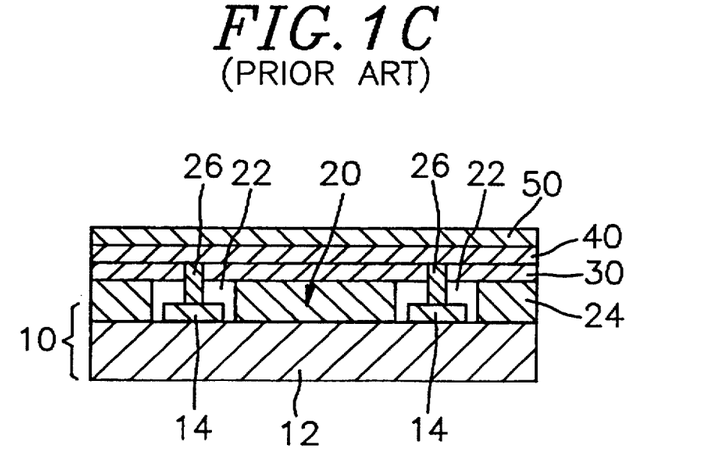

In a next step, a second thin film layer 40 made of an electrically conducting material is formed on top of the elastic layer 30 including the conduits 26 by using a sputtering method. The second thin film layer 40 is electrically connected to the transistors through the conduits 26 formed in the supporting members 22.

Then, a thin film electrodisplacive layer 50 made of a piezoelectric material, e.g., lead zirconium titanate (PZT), is formed on top of the second thin film layer 40 by using a sputtering method, a CVD method or a Sol-Gel method, as shown in FIG. 1C.

Figure 1D:
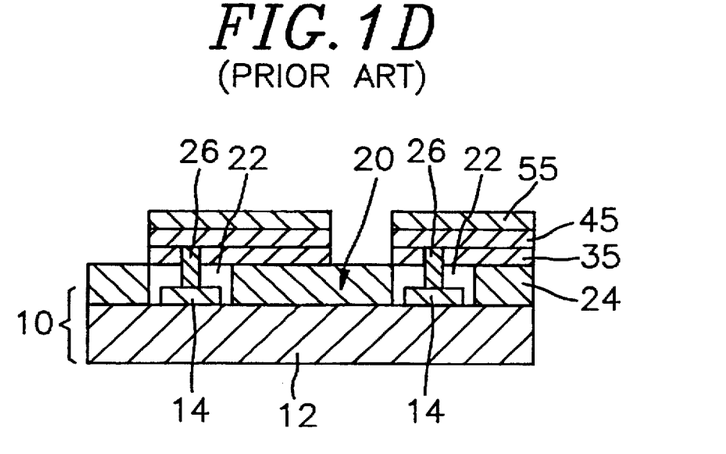

In an ensuing step, the thin film electrodisplacive layer 50, the second thin film layer 40 and the elastic layer 30 are patterned into an array of M x N thin film electrodisplacive members 55, an array of M x N second thin film electrodes 45 and an array of M x N elastic members 35 by using a photolithography or a laser trimming method until the supporting layer 20 is exposed, as shown in FIG. 1D. Each of the second thin film electrodes 45 is electrically connected to the transistor through the conduit 26 formed in each of the supporting members 22 and functions as a signal electrode in the thin film actuated mirrors 101.

Next, each of the thin film electrodisplacive members 55 is heat treated to allow a phase transition to take place to thereby form an array of M x N heat treated structures (not shown). Since each of the heat treated thin film electrodisplacive members 55 is sufficiently thin, there is no need to pole it in case it is made of a piezoelectric material: for it can be poled with the electric signal applied during the operation of the thin film actuated mirrors 101.

Figure 1E:
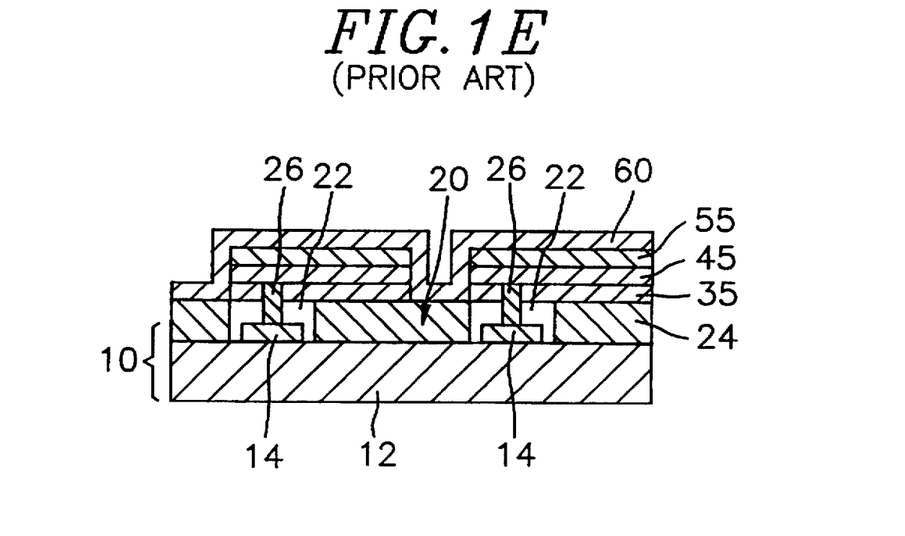
Figure 1F:
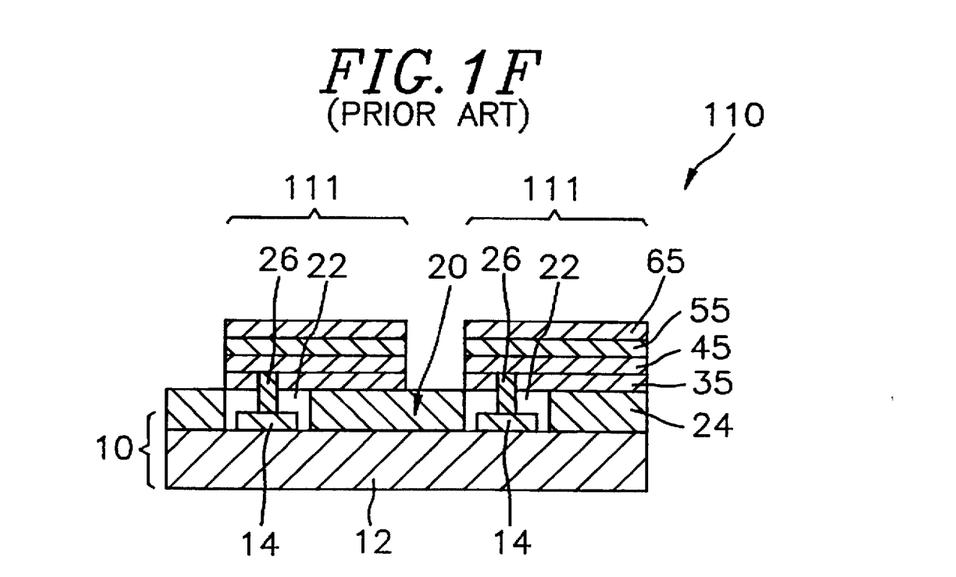

After the above step, an array of M x N first thin film electrodes 65 made of an electrically conducting and light reflecting material is formed on top of the thin film electrodisplacive members 55 in the array of M x N heat treated structures by first forming a layer 60, made of the electrically conducting and light reflecting material, completely covering top of the array of M x N heat treated structures, including the exposed supporting layer 20, using a sputtering method, as shown in FIG. 1E, and then selectively removing the layer 60, using an etching method, resulting in an array 110 of M x N actuated mirror structures 111, wherein each of the actuated mirror structures 111 includes a top surface and four side surfaces, as shown in FIG. 1F. Each of the first thin film electrodes 65 functions as a mirror as well as a bias electrode in the thin film actuated mirrors 101.

The preceeding step is then followed by completely covering the top surface and the four side surfaces in each of the actuated mirror structures 111 with a thin film protection layer (not shown).

Figure 1G:
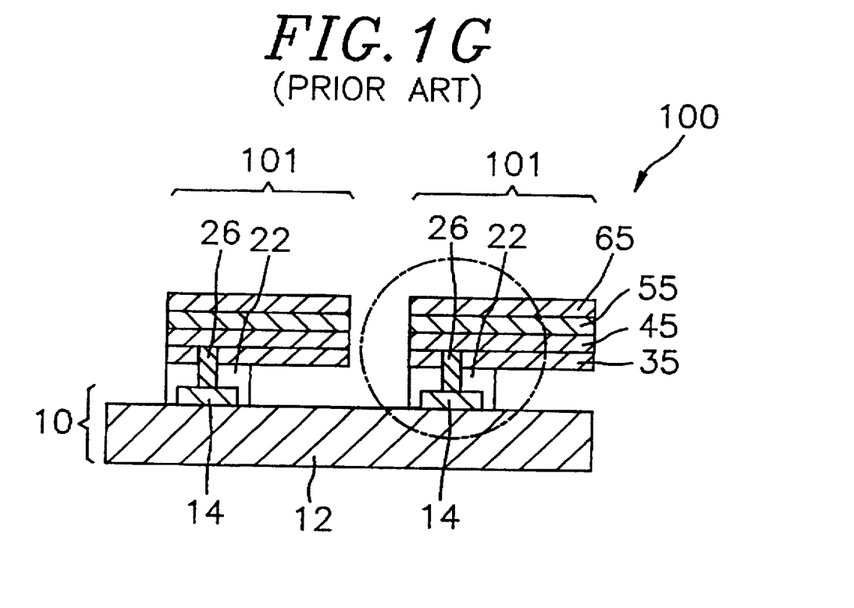
Figure 1H:
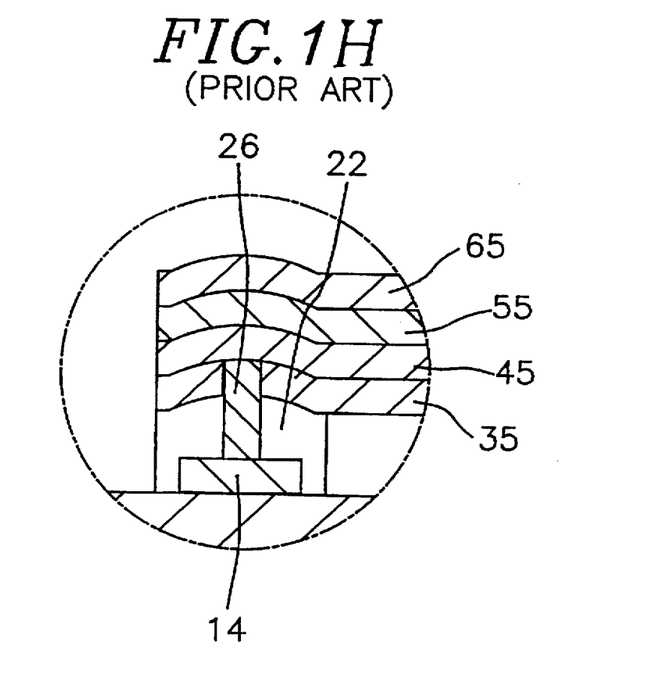

The thin film sacrificial layer 24 in the supporting layer 20 is then removed by using an wet etching method. Finally, the thin film protection layer is removed to thereby form the array 100 of M x N thin film actuated mirrors 101, as shown in FIG. 1G.

There are a number of shortcomings associated with the above described method for manufacturing the array 100 of M x N thin film actuated mirrors 101. One of the shortcomings is the overall optical efficiency of the array 100 thus prepared. Since the active matrix 10 provided for the manufacture of the array 100 has a roughened top surface by, e.g., the protruding connecting terminal 14 formed on top of the substrate 12, bumps are formed on the elastic member 35, the second thin film electrode 45, the thin film electrodisplacive member 55 and the first thin film electrode 65 in each of the thin film actuated mirrors 101, resulting in creating an area on the first thin film electrode 65, which also acts as a mirror, from which the light beams are reflected irregularly, as shown in detailed view of FIG. 1GA. As a result, the overall optical efficiency of the array 100 decreases. Furthermore, the fact that the active matrix 10 provided for the manufacture of the array 100 has the roughened top surface makes the overall process for the manufacture of the array 100 difficult.

SUMMARY OF THE INVENTION

It is, therefore, a primary object of the present invention to provide a method for the manufacture of an array of M x N thin film actuated mirrors for use in an optical projection system, the method being capable of providing the array having an improved optical efficiency.

In accordance with one aspect of the present invention, there is provided a method for the manufacture of an array of M x N thin film actuated mirrors, wherein M and N are integers, for use in an optical projection system, the method comprising the steps of: providing an active matrix including a substrate and an array of M x N connecting terminals; depositing a passivation layer on top of the active matrix, the passivation layer having a top surface; planarizing the top surface of the passivation layer; depositing an etchant stopping layer on the planarized top surface of the passivation layer; forming a thin film sacrificial layer having an array of M x N empty cavities on top of the etchant stopping layer; forming an array of M x N actuating structures on top of the thin film sacrificial layer including the empty cavities, each of the actuating structures including a first thin film electrode, a thin film electrodisplacive member, a second thin film electrode, an elastic member and a conduit; and removing the thin film sacrificial layer, thereby forming the array of M x N thin film actuated mirrors.

In accordance with another aspect of the present invention, there is provided a method for the manufacture of an array of M x N thin film actuated mirrors, wherein M and N are integers, for use in an optical projection system, the method comprising the steps of: providing an active matrix including a substrate and an array of M x N connecting terminals; depositing a passivation layer on top of the active matrix, the passivation layer having a top surface; depositing a planarization layer on the top surface of the passivation layer; removing the planarization layer while planarizing the top surface of the passivation layer; forming a thin film sacrificial layer having an array of M x N empty cavities on the planarized top surface of the passivation layer; forming an array of M x N actuating structures on top of the thin film sacrificial layer including the empty cavities, each of the actuating structures including a first thin film electrode, a thin film electrodisplacive member, a second thin film electrode, an elastic member and a conduit; and removing the thin film sacrificial layer, thereby forming the array of M x N thin film actuated mirrors.

BRIEF DESCRIPTION OF THE DRAWINGS

The above and other objects and features of the present invention will become apparent from the following description of the preferred embodiments, when given in conjunction with the accompanying drawings, wherein.

DETAILED DESCRIPTION OF THE PREFERRED EMBODIMENTS

There are provided in FIGS. 2A to 2F and 3A to 3G schematic cross sectional views setting forth methods for the manufacture of an array 300 of M x N thin film actuated mirrors 301, wherein M and N are integers, for use in an optical projection system, in accordance with the present invention, respectively. It should be noted that like parts appearing in FIGS. 2A to 2F and 3A to 3G are represented by like reference numerals.

In FIGS. 2A to 2F, there are presented schematic cross sectional views setting forth a method for the manufacture of the array 300 of M x N thin film actuated mirrors 301 in accordance with one embodiment of the present invention.

Figure 2A:
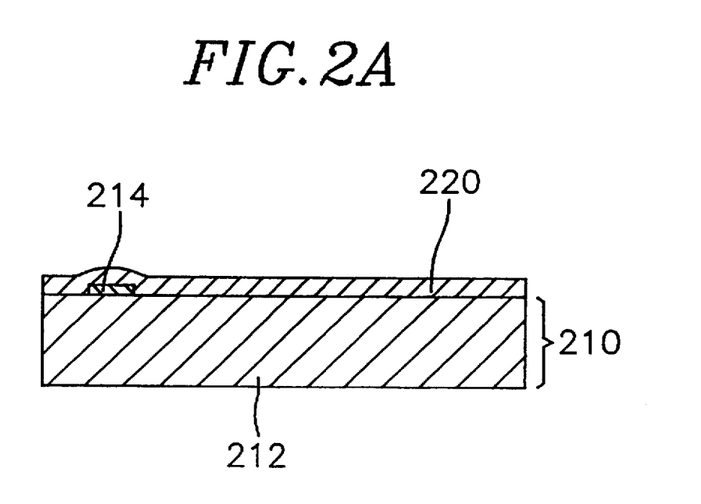
FIGS. 2A to 2F present schematic cross sectional views setting forth a method for the manufacture of an array of M x N thin film actuated mirrors in accordance with one embodiment of the present invention.

The process for the manufacture of the array 300 begins with the preparation of an active matrix 210 including a substrate 212, an array of M x N connecting terminals 214 and an array of M x N transistors (not shown), wherein each of the connecting terminals 214 is electrically connected to a corresponding transistor in the array of transistors. The active matrix 210 has a roughened top surface caused by, e.g., the existence of the connecting terminals 214 formed on top of the substrate 212.

In a subsequent step, there is deposited a passivation layer 220, made of an insulating material, e.g., phosphor-silicate glass (PSG) or borophosphor-silicate glass (BPSG), and having a thickness capable of sheltering the roughened top surface of the active matrix 210, e.g., 2–3 μm, on top of the active matrix 210 by using, e.g., an atmospheric pressure chemical vapor deposition (APCVD) method, as shown in FIG. 2A, wherein the passivation layer 220 has a top surface.

Figure 2B:
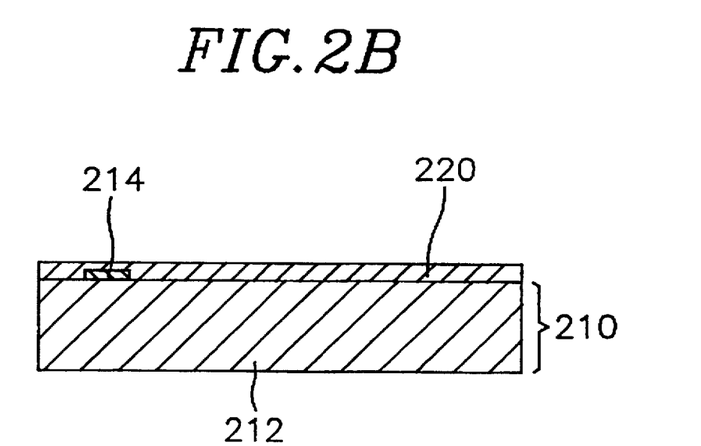

Thereafter, the top surface of the passivation layer 220 is planarized by using a chemical mechanical polishing (CMP) method, as show in FIG. 2B.

Figure 2C:
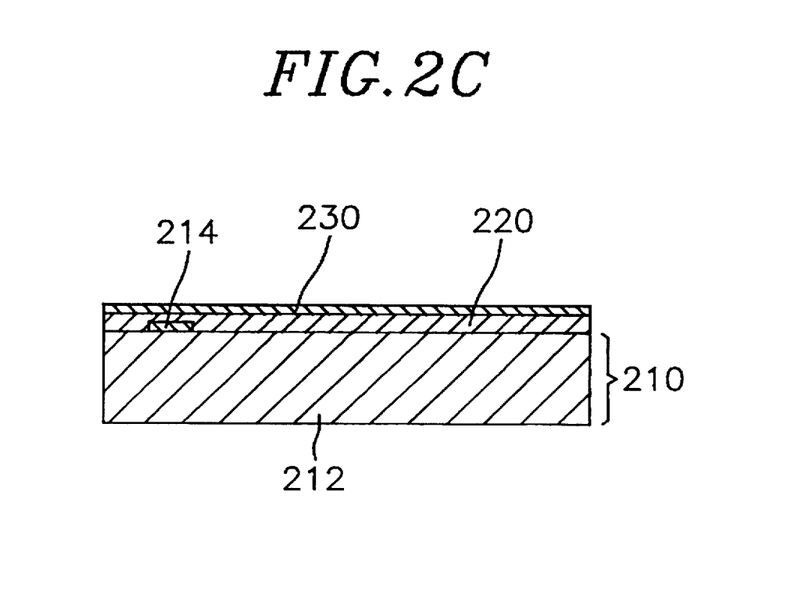

In an ensuing step, an etchant stopping layer 230, made of an insulating material, e.g., silicon nitride, and having a thickness of 0.1–2 μm, is deposited on the planarized top surface of the passivation layer 220 by using, e.g., a low pressure chemical vapor deposition (LPCVD) or a plasma enhanced chemical vapor deposition (PECVD) method, as shown in FIG. 2C.

In a following step, there is formed on top of the etchant stopping layer 230 a thin film sacrificial layer 250, having a thickness of 0.1–2 μm, and made of a metal, e.g., copper (Cu) or nickel (Ni), a phosphor-silicate glass (PSG) or a poly-Si. The thin film sacrificial layer 250 is formed by using a sputtering or an evaporation method if the thin film sacrificial layer 250 is made of a metal, a CVD or a spin coating method if the thin film sacrificial layer 250 is made of a PSG, or a CVD method if the thin film sacrificial layer 250 is made of a poly-Si.

Subsequently, an array of M x N empty cavities (not shown) is created on the thin film sacrificial layer 250 in such a way that each of the empty cavities encompasses one of the connecting terminals 214 by using an etching method.

Figure 2D:
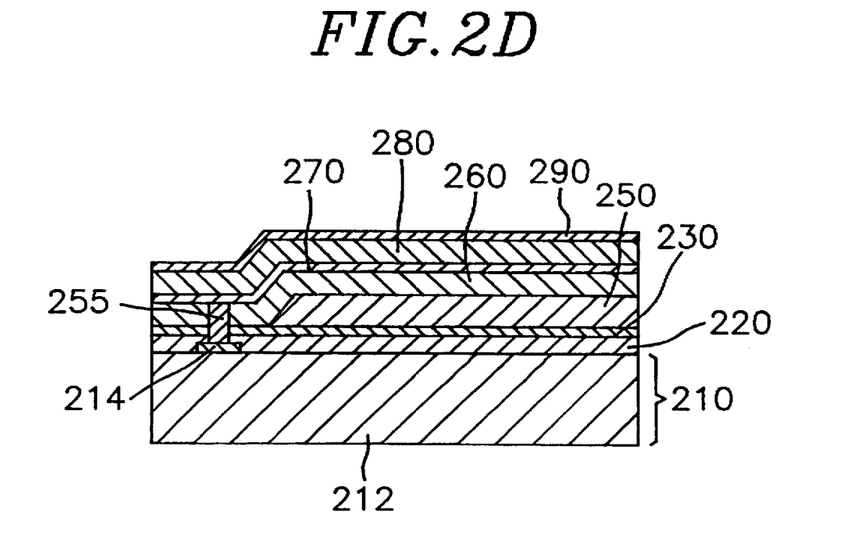

In a next step, an elastic layer 260, made of an insulating material, and having a thickness of 0.1–2 μm, is deposited on top of the thin film sacrificial layer 250 including the empty cavities by using a CVD method.

Thereafter, there is formed in the elastic layer 260 an array of M x N conduits 255 made of a metal. Each of the conduits 255 is formed by: first creating an array of M x N holes (not shown), each of the holes extending from top of the elastic layer 260 to top of the connecting terminal 214 by using an etching method; and filling therein with the metal by using, e.g., a lift-off method.

Then, a second thin film layer 270, made of an electrically conducting material, and having a thickness of 0.1–2 μm, is formed on top of the elastic layer 260 including the conduits 255 by using a sputtering or a vacuum evaporation method.

Next, a thin film electrodisplacive layer 280, made of a piezoelectric or an electrostrictive material, and having a thickness of 0.1–2 μm, is formed on top of the second thin film layer 270 by using a CVD method, an evaporation method, a Sol-Gel method or a sputtering method. The thin film electrodisplacive layer 280 is then heat treated to allow a phase transition to take place.

In an ensuing step, a first thin film layer 290, made of an electrically conducting and light reflecting material, and having a thickness of 0.1–2 μm, is formed on top of the thin film electrodisplacive layer 280 by using a sputtering or a vacuum evaporation method, as shown in FIG. 2D.

Figure 2E:
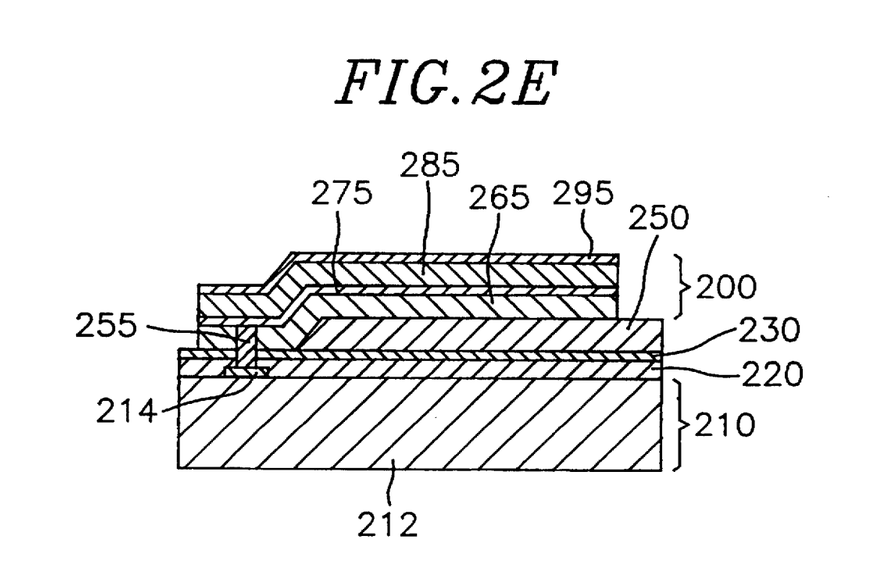

After the above step, the first thin film 290, the thin film electrodisplacive 280, the second thin film 270 and the elastic layers 260 are, respectively, patterned, until the thin film sacrificial layer 250 is exposed, by using a photolithography or a laser trimming method, thereby forming an array of M x N actuating structures 200, each of the actuating structures 200 including a first thin film electrode 295, a thin film electrodisplacive member 285, a second thin film electrode 275, an elastic member 265 and the conduit 255, as shown in FIG. 2E. The second thin film electrode 275 is electrically connected to the connecting terminal 214 through the conduit 255, thereby functioning as a signal electrode in each of the actuating structures 200. The first thin film electrode 295 is electrically connected to ground, thereby functioning as a mirror as well as a common bias electrode in each of the actuating structures 200.

Since each of the thin film electrodisplacive members 285 is sufficiently thin, there is no need to pole it in case it is made of a piezoelectric material: for it can be poled with the electric signal applied during the operation of the thin film actuated mirrors 301.

Figure 2F:
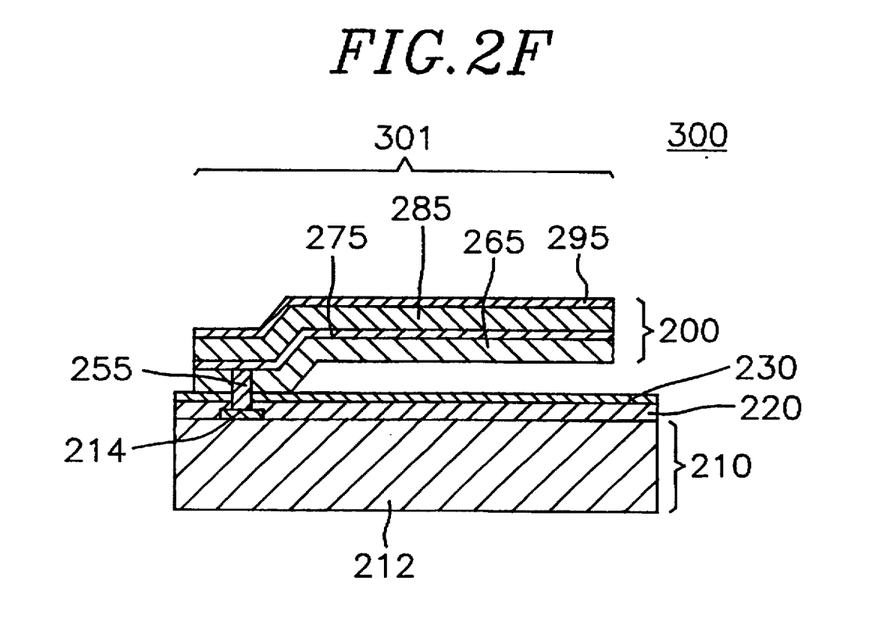

Finally, the thin film sacrificial layer 250 is removed, to thereby form the array 300 of M x N thin film actuated mirrors 301, as shown in FIG. 2F.

In FIGS. 3A to 3F, there are provided schematic cross sectional views setting forth a method for the manufacture of the array 300 of M x N thin film actuated mirrors 301 in accordance with another embodiment of the present invention.

Figure 3A:
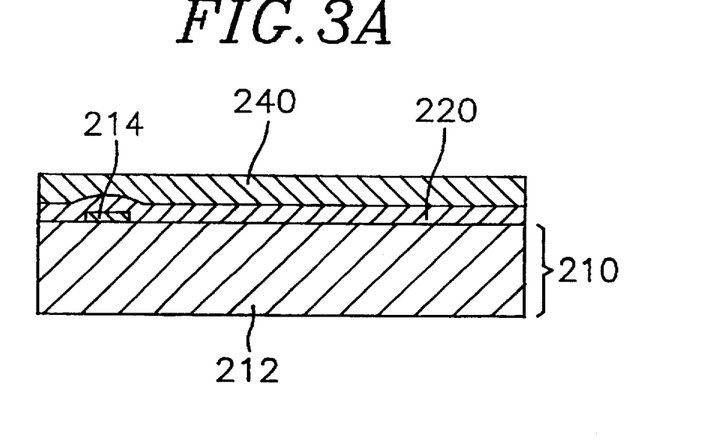
FIGS. 3A to 3G show schematic cross sectional views setting forth a method for the manufacture of an array of M x N thin film actuated mirrors in accordance with another embodiment of the present invention.

The process for the manufacture of the array 300 begins with the preparation of an active matrix 210 including a substrate 212, an array of M x N connecting terminals 214 and an array of M x N transistors (not shown), wherein each of the connecting terminals 214 is electrically connected to a corresponding transistor in the array of transistors. The active matrix has a roughened top surface caused by, e.g., the existence of the connecting terminals 214 formed on top of the substrate 212.

In a subsequent step, there is deposited a passivation layer 220, made of an insulating material, e.g., phosphor-silicate glass (PSG) or borophosphor-silicate glass (BPSG), and having a thickness capable of sheltering the roughened top surface of the active matrix 210, e.g., 2–3 μm, on top of the active matrix 210 by using, e.g., a CVD method, wherein the passivation layer 220 has a top surface.

In an ensuing step, there is formed on the top surface of the passivation layer 220 a planarization layer 240 made of a viscous polymer, e.g., accuflo, by using a spin coating method employing a solvent, e.g., ethyl lactate, as shown in FIG. 3A.

Figure 3B:
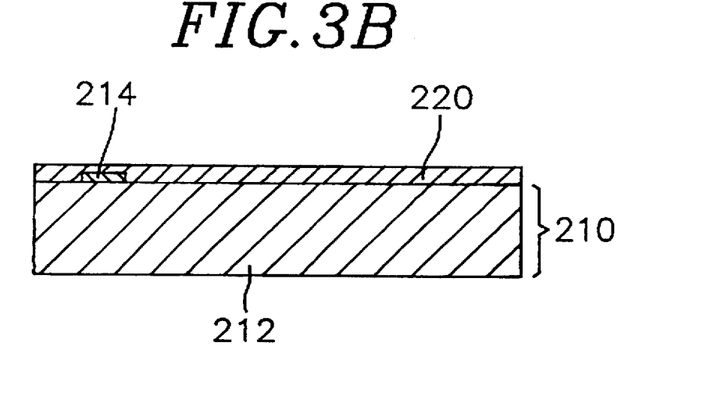

Next, the planarization layer 240 is removed while planarizing the top surface of the passivation layer 220 by using an etch back method, e.g., plasma etching method employing $CF_4$ and $O_2$ plasma, or a CMP method, as shown in FIG. 3B. The solvent used in the formation of the planarization layer 240 is then removed by evaporating thereof, under a temperature ranging from 150° C. to 250° C. for 90 to 150 seconds, by using a hot plate baking method.

Figure 3C:
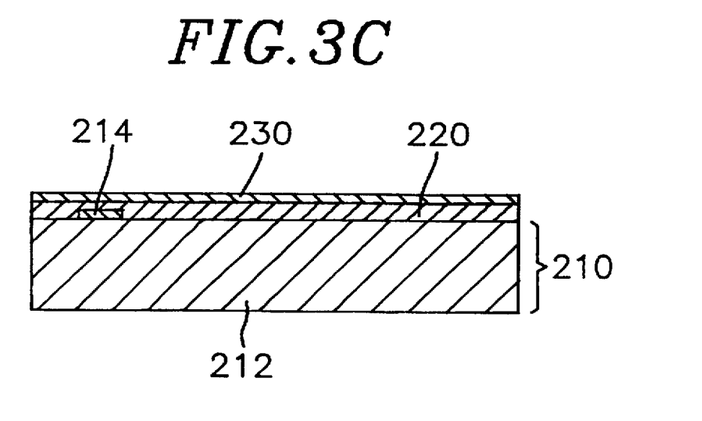
Figure 3D:
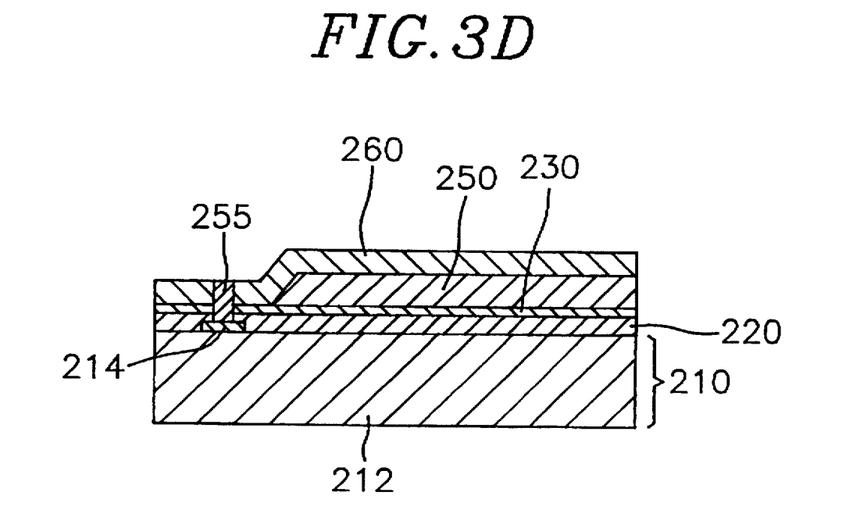
Figure 3E:
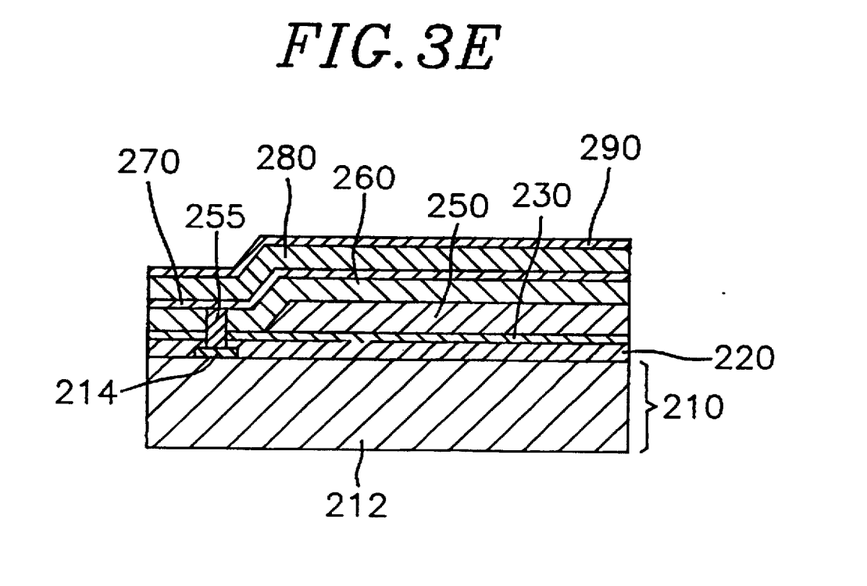
Figure 3F:
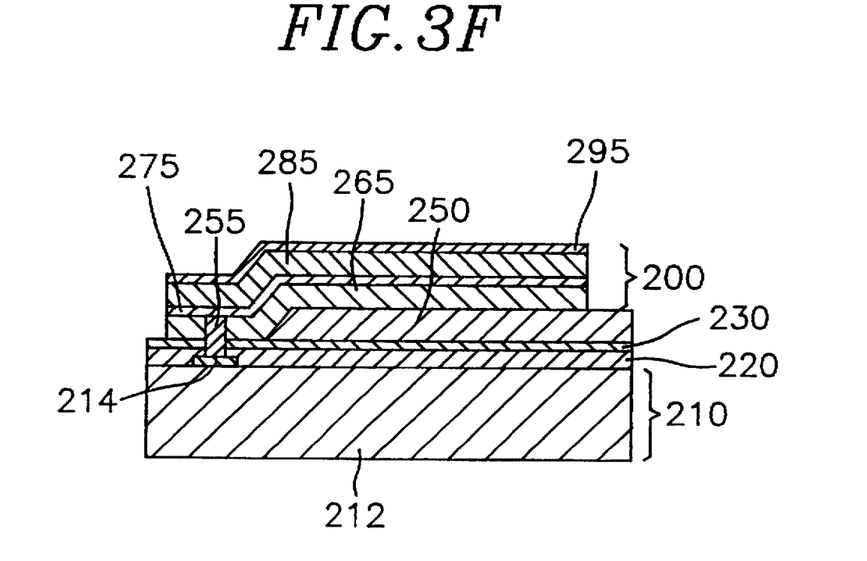
Figure 3G:
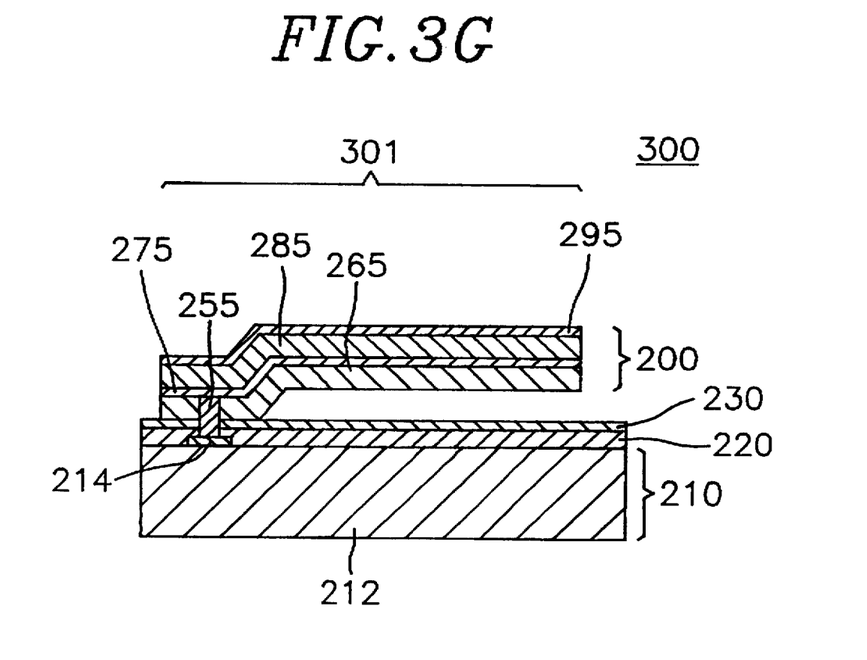

Thereafter, an etchant stopping layer 230, made of an insulating material, e.g., silicon nitride, and having a thickness of 0.1–2 μm, is deposited on the planarized top surface of the passivation layer 220 by using, e.g., a low pressure chemical vapor deposition (LPCVD) or a plasma enhanced chemical vapor deposition (PECVD) method, as shown in FIG. 3C.

The preceeding steps shown in FIGS. 3D to 3G are same as the processes in accordance with one embodiment of the present invention illustrated in FIGS. 2D to 2F, thereby forming the array 300 of M x N thin film actuated mirrors 301.

In the inventive method for the manufacture of the array 300 of M x N thin film actuated mirrors 301, since the thin film layers constituting each of the actuating structures 200 are formed on the planarized top surface of the passivation layer 220, the thin film layers constituting each of the actuating structures 200 are flat, allowing the first thin film electrode 295 placed on top thereof, which also acts as a mirror, to have a flat top surface, thereby increasing the overall performance and optical efficiency of the array 300.

It should be mentioned that, even though, each of the thin film actuated mirrors 301 prepared using the inventive method has an unimorph structure, the inventive method can be equally well applied to manufacturing an array of thin film actuated mirrors, each of the thin film actuated mirrors having a bimorph structure, for the latter case just involves formation of additional electrodisplacive and electrode layers.

It should be further noted that the inventive method can be modified to allow a manufacturing an array of thin film actuated mirrors having a different geometry.

While the present invention has been described with respect to certain preferred embodiments only, other modifications and variations may be made without departing from the scope of the present invention as set forth in the following claims.

What is claimed is:

1. A method for the manufacture of an array of thin film actuated mirrors for use in an optical projection system, the method comprising the steps of:

providing an active matrix;

depositing a passivation layer on top of the active matrix, wherein the passivation layer has a top surface;

planarizing the top surface of the passivation layer;

depositing an etchant stopping layer on the planarized top surface of the passivation layer;

forming a thin film sacrificial layer having an array of empty cavities on top of the etchant stopping layer;

forming an array of actuating structures on top of the thin film sacrificial layer including the empty cavities, each of the actuating structures including a first thin film electrode, a thin film electrodisplacive member, a second thin film electrode and an elastic member; and removing the thin film sacrificial layer, thereby forming the array of thin film actuated mirrors.

2. The method of claim 1, wherein the passivation layer is made of phosphor-silicate glass (PSG).

3. The method of claim 1, wherein the passivation layer is made of borophosphor-silicate glass (BPSG).

4. The method of claim 1, wherein the passivation layer is deposited in a thickness of 2–3 μm.

5. The method of claim 1, wherein the passivation layer is deposited by using an atmospheric pressure chemical vapor deposition (APCVD) method.

6. The method of claim 1, wherein the top surface of the passivation layer is planarized by using a chemical mechanical polishing (CMP) method.

7. A method for the manufacture of an array of thin film actuated mirrors for use in an optical projection system, the method comprising the steps of:

providing an active matrix;

depositing a passivation layer on top of the active matrix, the passivation layer having a top surface;

depositing a planarization layer on the top surface of the passivation layer;

removing the planarization layer while planarizing the top surface of the passivation layer;

forming a thin film sacrificial layer having an array of empty cavities on the planarized top surface of the passivation layer;

forming an array of actuating structures on top of the thin film sacrificial layer including the empty cavities, each of the actuating structures including a first thin film electrode, a thin film electrodisplacive member, a second thin film electrode and an elastic member; and removing the thin film sacrificial layer, thereby forming the array of thin film actuated mirrors.

8. The method of claim 7, wherein the planarization layer is deposited by using a spin coating method.

9. The method of claim 8, wherein the planarization layer is made of a viscous polymer.

10. The method of claim 7, wherein the planarization layer is removed while planarizing the top surface of the passivation layer by using a CMP method.

11. The method of claim 7, wherein the planarization layer is removed while planarizing the top surface of the passivation layer by using an etch back method.

12. The method of claim 11, wherein the etch back method for planarizing the top surface of the passivation layer is a plasma etching method employing $CF_4$ and $O_2$ plasma.

\* \* \* \* \*